United States Patent [19]

Morton et al.

[11] Patent Number: 5,103,402

[45] Date of Patent: Apr. 7, 1992

[54] METHOD AND APPARATUS FOR IDENTIFYING, SAVING, AND ANALYZING CONTINUOUS FREQUENCY DOMAIN DATA IN A SPECTRUM ANALYZER

[75] Inventors: Steven R. Morton, Beaverton; John C. Domogalla, Portland, both of Oreg.

[73] Assignee: Tektronix, Inc., Beaverton, Oreg.

[21] Appl. No.: 215,125

[22] Filed: Jul. 5, 1988

[51] Int. Cl.[5] .......................... G10L 5/00; G06F 15/34
[52] U.S. Cl. .................................................... 364/485
[58] Field of Search .......................................... 364/485

[56] References Cited

U.S. PATENT DOCUMENTS 4,093,989  6/1978  Flink et al. ............................ 364/485
4,649,496  3/1987  Anderson et al. ................... 364/485

OTHER PUBLICATIONS

Hewlett-Packard, 3561A Dynamic Signal Analyzer Operating Manual, Nov. 1983, pp. 29-33 and 48-53.
Marconi Instruments Ltd., 100 Hz 400 Mhz Spectrum Analyzer and Display 2382/2380, 1986, p. 1-3 and 3-18.
Matsushita, VS-3311A FFT Analyzer page of catalog, date unknown, pp. 205 and 206.

Primary Examiner—Emanuel S. Kemeny
Attorney, Agent, or Firm—Boulden G. Griffith

[57] ABSTRACT

As frequency spectra are produced continuously at a speed that is too fast for realtime display, they are accumulated in a memory. After a block of these frequency spectra have been accumulated, they are read back from the memory and displayed on a display device that permits the display of multiple frequency spectra along a time axis. Markers allow delta-time measurements to be made between different spectra in the display. Continuous storage into a circular memory can be stopped and the display of the accumulated frequency spectra started by the detection of the occurrence of a predefined spectra event.

11 Claims, 4 Drawing Sheets

METHOD AND APPARATUS FOR IDENTIFYING, SAVING, AND ANALYZING CONTINUOUS FREQUENCY DOMAIN DATA IN A SPECTRUM ANALYZER

BACKGROUND OF THE INVENTION

This invention relates to the field of spectrum analysis of electronic signals, and more particularly to the field of methods and apparatuses for identifying, saving, and analyzing continuously generated frequency domain information.

Digital spectrum analyzers have been able to acquire data faster than they can process it. And, as they improve their capabilities for processing data, they often can process data faster than they can display it. This display 'bottleneck' results in discontinuities in the displayed data. That is, while one set of data is being displayed, additional data is acquired, processed, and lost before the display mechanism is ready to display another set of data. This means that data presented to the operator as contiguous or sequential, is in fact interspersed with gaps.

Further, triggers have been used in spectrum analyzers to start acquisition, or stop it, but these have always been triggers based on time domain information about the input signal under analysis, or triggers derived from some external source, not triggers derived from frequency domain information. And, while some spectrum analyzers have had means for identifying a spectral event for the purpose of providing a go/no-go indication, previously no spectrum analyzer has used the identification of a spectral event to trigger data acquisition or data storage.

What is desired is a method of identifying a spectral event, that is an event defined in the frequency domain, and, in response to that identification, or in response to a command from an operator, being able to accumulate and display for operator analysis all of the data pertaining to some particular interval of interest, so multiple frequency spectra that fully describe a continuous history of the activity of the signal in the time domain over the period of interest may be viewed and analyzed by the operator of a spectrum analyzer.

SUMMARY OF THE INVENTION

The present invention provides a method and apparatus for analyzing frequency spectra which are produced continuously at a speed that is too fast for realtime display. These spectra, which represent a continuous monitoring of the signal under analysis, are accumulated in a memory over an interval of interest, until a block of these frequency spectra have been accumulated. They are then read back from memory and displayed on a device that permits the display of multiple frequency spectra along a time axis. Markers are provided for delta-time measurements to be made between different spectra in the display. Continuous storage into a circular memory can be stopped by the detection of a pre-defined spectral event, thus permitting analysis of all of the spectra which as a group continuously describe the frequency domain activity of a time varying electronic signal over a particular interval of interest.

DETAILED DESCRIPTION

A spectrum analyzer is an electronic instrument for providing a frequency domain view of an electrical signal. In a digital spectrum analyzer, a series of amplitude measurements of the signal under analysis are made over time and the values measured are converted to digital words. This stream of digital words is a time domain description of the variations in signal amplitude. A Fourier transform of this time domain information produces a frequency domain description of the same information. This frequency domain description of the electronic signal under analysis can be displayed to an operator as a graph of signal power versus frequency, allowing the operator to analyze the signal's spectral content.

Figure 1:
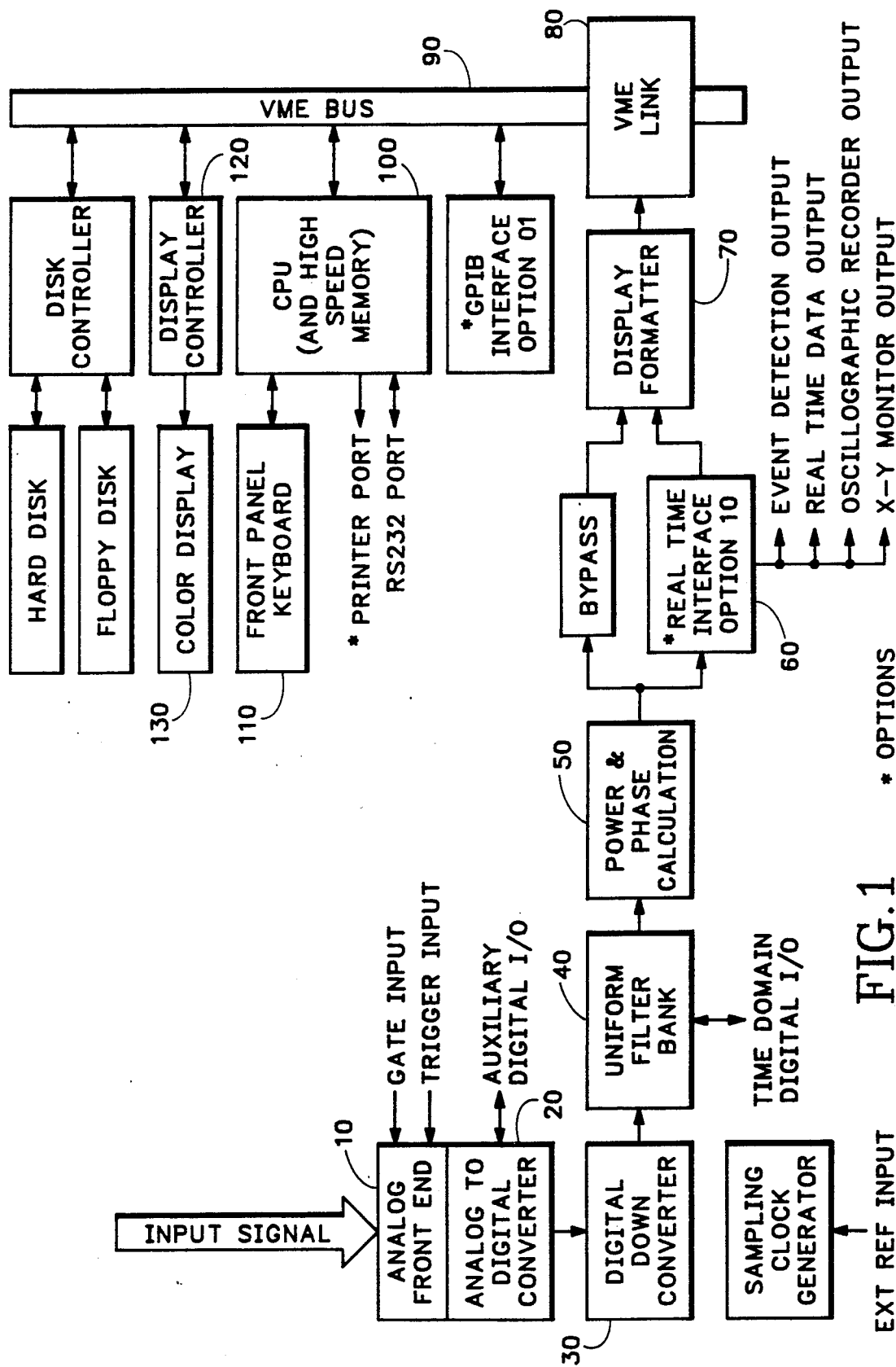
FIG. 1 is a block diagram of a digital spectrum analyzer that embodies the present invention.

Referring to FIG. 1, time varying electronic signal under analysis is the input signal to an Analog Front End 10 of spectrum analysis instrument. The Analog Front End 10 provides attenuation and amplification as required by the level of the input signal, and has facilities for gating the input or responding to an external (time domain) trigger. The Analog Front End 10 also provides an anti-aliasing (low pass) filter, necessary to the sampling function. The Analog to Digital Converter 20 turns the conditioned analog input into a series of digital words describing the amplitude of the signal as it is sampled at a rate of 25.6 mega samples per second, providing a useful input signal bandwidth of 10 MHz.

Digital Down Converter 30 shifts the 10 MHz input bandwidth down by a selectable frequency between 500 Hz and 9.9995 MHz., then performs a low pass filtering process on the resulting complex signal, and provides the filtered output, suitably decimated, to the Uniform Filter Bank 40 which includes a fast Fourier transformation (FFT) processor.

It should be understood that to convert information in the time domain to the frequency domain, a digital spectrum analyzer performs a Fourier transformation by some variation on the method known as discrete Fourier transform (DFT). Usually this DFT is accomplished using one of the algorithms known as fast Fourier transforms (FFT). Numerous patents, textbooks, and articles in the literature describe the FFT and its variations. However, all methods of performing the FFT require a certain minimum amount of time and the application of some amount of computing resources. In the instrument being described this function resides in the Uniform Filter Bank 40.

The output of the Uniform Filter Bank 40 is a set of 1024 pairs of digital words describing as complex numbers the frequency distribution of the input signal over the 1024 frequency bins of one spectral frame. The spectral data in this format is then input to the Power and Phase Calculation circuitry 50, which produces 1024 power levels and 1024 phase angles describing each of the 1024 bins in the spectral frame in terms of power and phase angle.

The optional Real Time Interface 60 receives the spectral information in both of the forms described above, complex signal pairs and power and phase format, and makes it available to the external world of other devices in several diverse forms. More important to the invention at hand, this Real Time Interface 60 also performs "event detection", by comparing the power information to two comparison masks. An "event" occurs when the amplitude of one of the spectra being monitored exceeds a maximum limit or falls below a minimum limit set by the operator.

Figure 2:
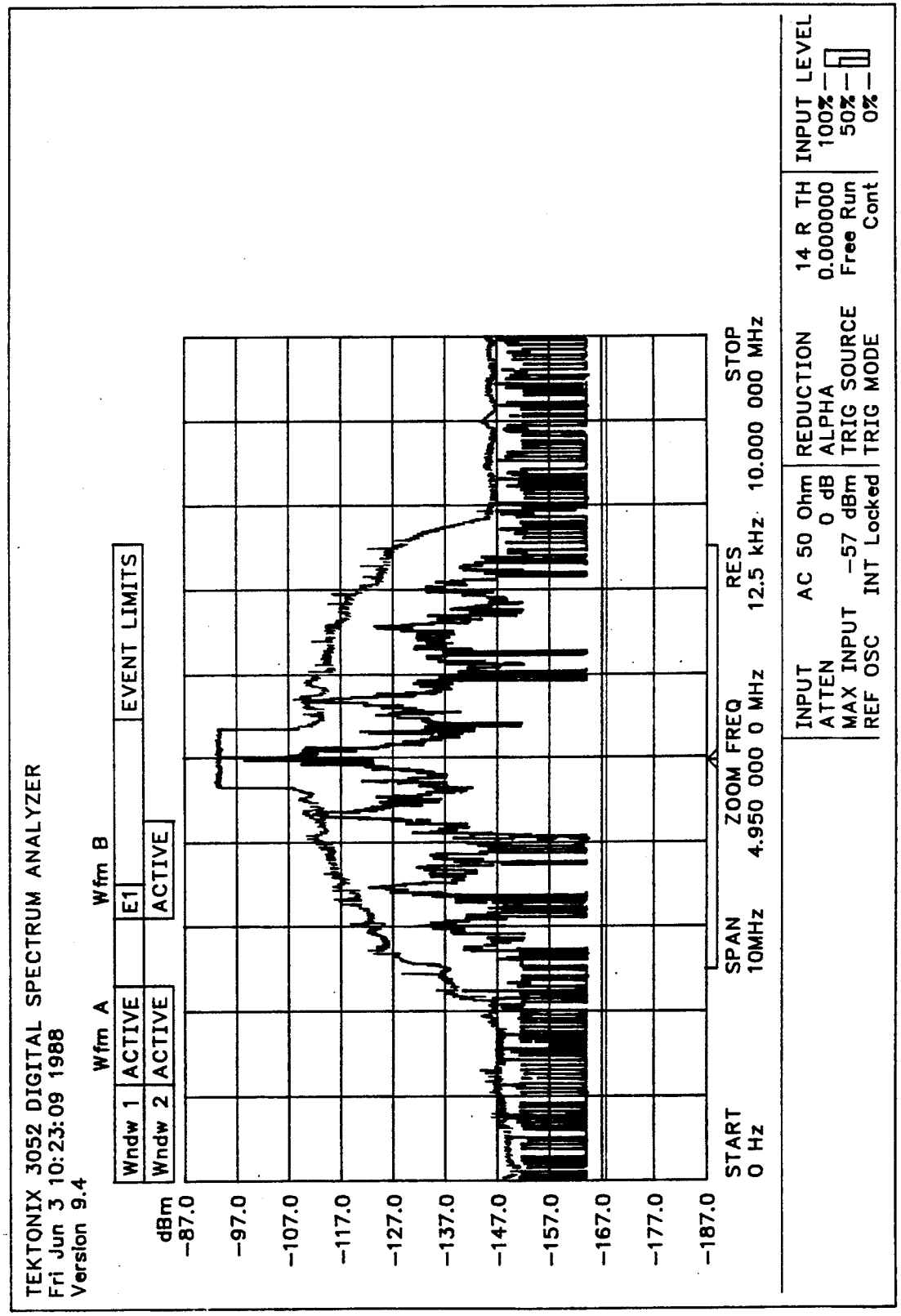
FIG. 2 is an amplitude versus frequency display showing a defined spectral event.

The operator can define an event by a variety of means via Front Panel Keyboard 110 or another terminal connected to the CPU 100 by any of its available communication ports. Refer to FIG. 2 for an example of an event definition mask as it appears to the operator. This particular event definition mask was generated by using the "max hold" capabilities of the Display Formatter 70 to accumulate a history of the most extreme amplitude excursions at every frequency within the span. Other methods of defining the event definition mask include drawing it with the motion of one of the cursors, typing the definition in at the keyboard, and adding a constant offset to stored spectral waveforms.

The CPU 100 responds to the operator's event definition by sending two event definition masks, one for minimum values and one for maximum values, to the Real Time Interface 60. As the spectral information, particularly power information, emerges from the Power and Phase Calculation circuitry 50, the Real Time Interface compares it with the event definition masks to determine if the amplitude in any bin exceeds the maximum or is less than the minimum, in which case an event detection output is generated. This event detected output is available externally, but is also used internally to stop or start the storage of spectral information.

The Display Formatter 70 performs a variety of data reduction operations on the stream of power and phase information coming from the Power & Phase Calculation circuitry 50. Because the display mechanism, and for that matter the human eye and mind, are incapable of coping with a new display every 200 usec (which is the maximum rate that they can be generated by the Uniform Filter Bank 40), it is necessary to perform some sort of data reduction in order to permit the operator to assimilate the data in real time. The Display Formatter 70 therefore performs data reduction in one of several ways selectable by the operator. Frames can be discarded according to some decimation factor, R. Several frames can be averaged to produce a single frame summary of what has transpired. Peak or minimum values may be stored and selected for display.

All of the foregoing techniques involve some sort of compression of the data in order to allow the display and the operator to keep up with realtime spectral calculations being performed by the Uniform Filter Bank 40. None of these methods allow the operator to scrutinize all of the spectral activity frame-by-frame.

The present invention provides a way for the operator to see everything that occurred during a particular period of interest. Rather than compressing this frequency domain data, or decimating it and introducing time gaps, it is accumulated intact for leisurely display later. Moreover, using the spectral event definitions, the operator can define in the frequency domain which data is of interest. And, because this frequency domain data describes without gaps in time the activity which occurred in the time domain, delta-time measurements and detailed operator analysis can operate on a complete history of the spectral activity during an interval of interest.

If the operator has selected "block mode", indicating his desire to see all of the spectral frames in a block later, rather than some representative samples or compressed data now, all of the spectral information from the Power & Phase Calculation circuitry 50 will be passed through the Display Formatter 70 and presented to the VME Link 80. The data for one spectral frame consists of two 16-bit values for each of the 1024 bins in the frame. One of these 16-bit values is the power information and the other is the phase information.

The VME Link 80 discards some of this information and reorganizes the rest of it for transmission over the VME Bus 90. Because the bins near the beginning and end of the 1024 bin frame contain data that is partially corrupted by leakage and the shape o f the anti-aliasing filters in the Analog Front End 10, it is desirable to only display the central 800 bins of each spectral frame. Therefore, 224 bins of information, 112 at each end of each frame, are discarded before the data is forwarded to the CPU (and High Speed Memory) 100 for eventual display.

The data for the remaining 800 bins of the frame is also reorganized by the VME Link 80 before transmission. As it comes from the Power and Phase Calculation circuitry 50, the power value for a particular bin and the phase angle value for the same bin appear next to each other in the stream of data. When they leave the VME Link 80 they have been reorganized so that all 800 power values go out in sequence, followed by all 800 phase angle values.

In addition to reorganizing and selecting the data, the VME Link 80 also adds 32 bits of timestamp information to each frame of spectral data. The timestamp information is derived from the system's tightly controlled reference oscillator. This association between individual spectra and the time of their generation, permits calculations to be performed later that provide delta-time measurement capabilities. These times are also used to generate the relative times with which the time axis of the displays are labeled.

Figure 3:
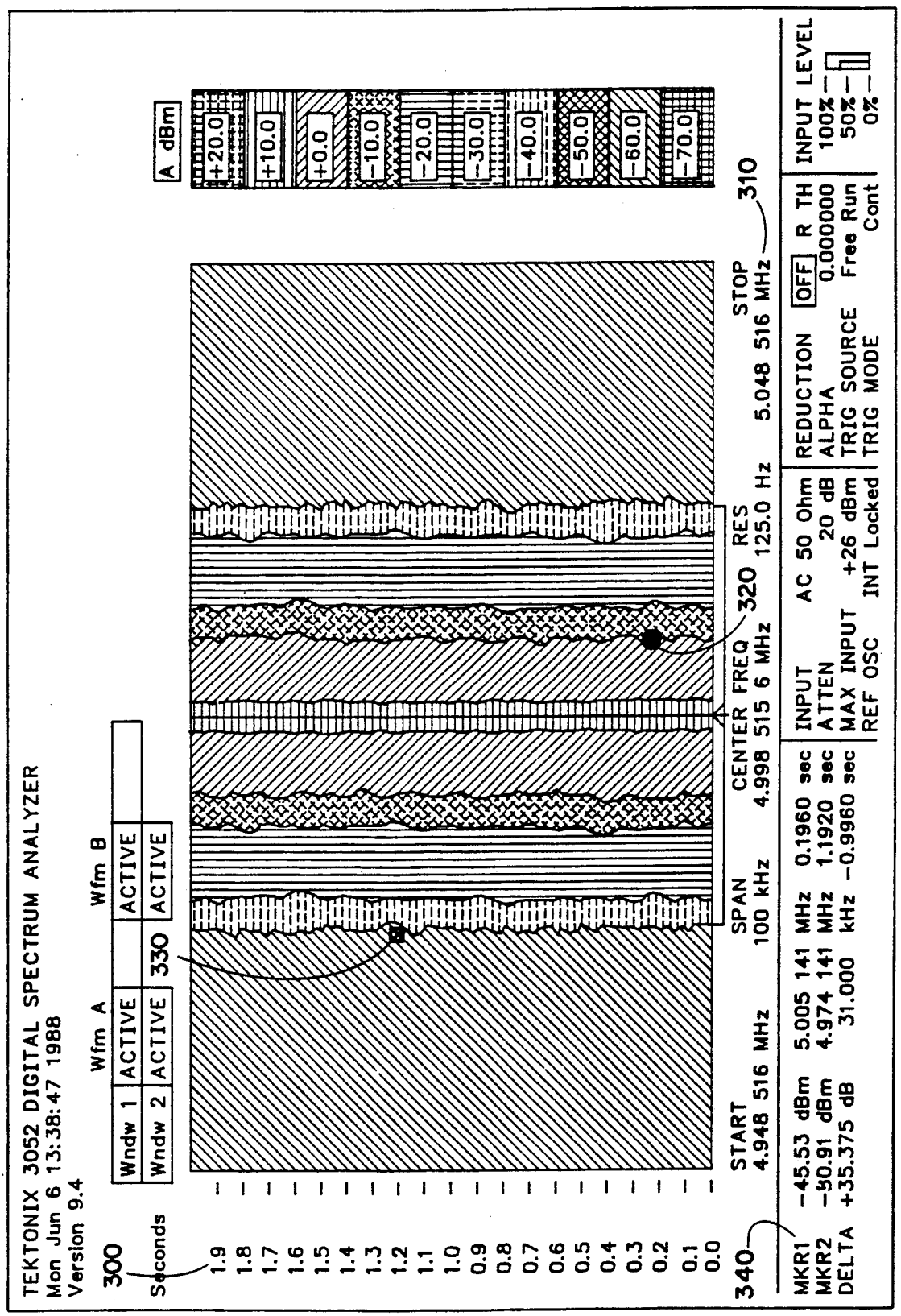
FIG. 3 is a color spectrogram display with a block of data displayed according to the present invention and with markers shown for measuring the time between two events.

In the block mode of handling spectral data, this stream of continuously generated spectral information, as formatted and timestamped by the VME Link 80, is sent over the VME Bus 90 by a direct memory access (DMA) to the High Speed (static) Memory in the CPU (and High Speed Memory) 100. After a sufficient number of frames have been placed in the High Speed Memory, the CPU 100 creates a display image for forwarding to the Display Controller 120. This display image created by the CPU 100 consists of one or two separate display windows, labels, readouts, color scales, and a variety of miscellaneous information, as shown in FIG. 3. The Display Controller 120 manages this image on the Color Display 130, scrolling portions of it as directed by the CPU 100, and receives updates from the CPU that modify its contents.

Even though the FFT calculations of the spectra can occur at a rate that the color spectrogram cannot keep up with, continuous spectral information can be passed to the High Speed Memory associated with the CPU 100 fast enough to preserve all of the information. Furthermore, time domain data acquisition and FFT calculation can proceed while the resulting output is sent to a circular portion of the memory address space. Then, upon the occurrence of a user command or upon the detection of a defined spectral event, the overwriting of this circular portion of memory can be stopped after any amount of desired delay and the contents of the circular portion of the memory displayed as a block.

By changing the number of spectral frames that are stored in the circular memory after an event has been detected, the position of the spectral event within the display of a block of continuous spectral data can be controlled. This allows the operator of the spectrum analyzer to view the spectral history preceding the defined event, or the spectral activity following the defined event, or some combination of the two.

The technique of positioning a trigger within a prefilled circular data acquisition memory is well known in the time domain (for example in logic analyzers), but it is novel to use a similar technique where the accumulated data as well as the triggering mechanism is defined in the frequency domain.

Referring now to FIG. 3, a color spectrogram display consists of a number of spectra aligned along a vertical time axis 300, while the frequencies that they describe are shown on the horizontal axis 310. The amplitude values of the spectra at each frequency are shown by colors. The time axis 300 is labeled with a time that represents the interval between the timestamp of the spectrum at that point on the spectrogram and the timestamp of the spectrum at the bottom of the display.

Two markers, a primary marker 320 and a secondary marker 330, are available for identifying particular locations within the spectrogram display. For each marked location a readout 340 indicates the values of frequency, amplitude, and time at that point in the display. An additional field in this readout labeled DELTA gives values for the differences in frequency, amplitude, and time between the locations of the two markers. Facilities (not shown) are provided elsewhere for controlling marker movement.

Figure 4:
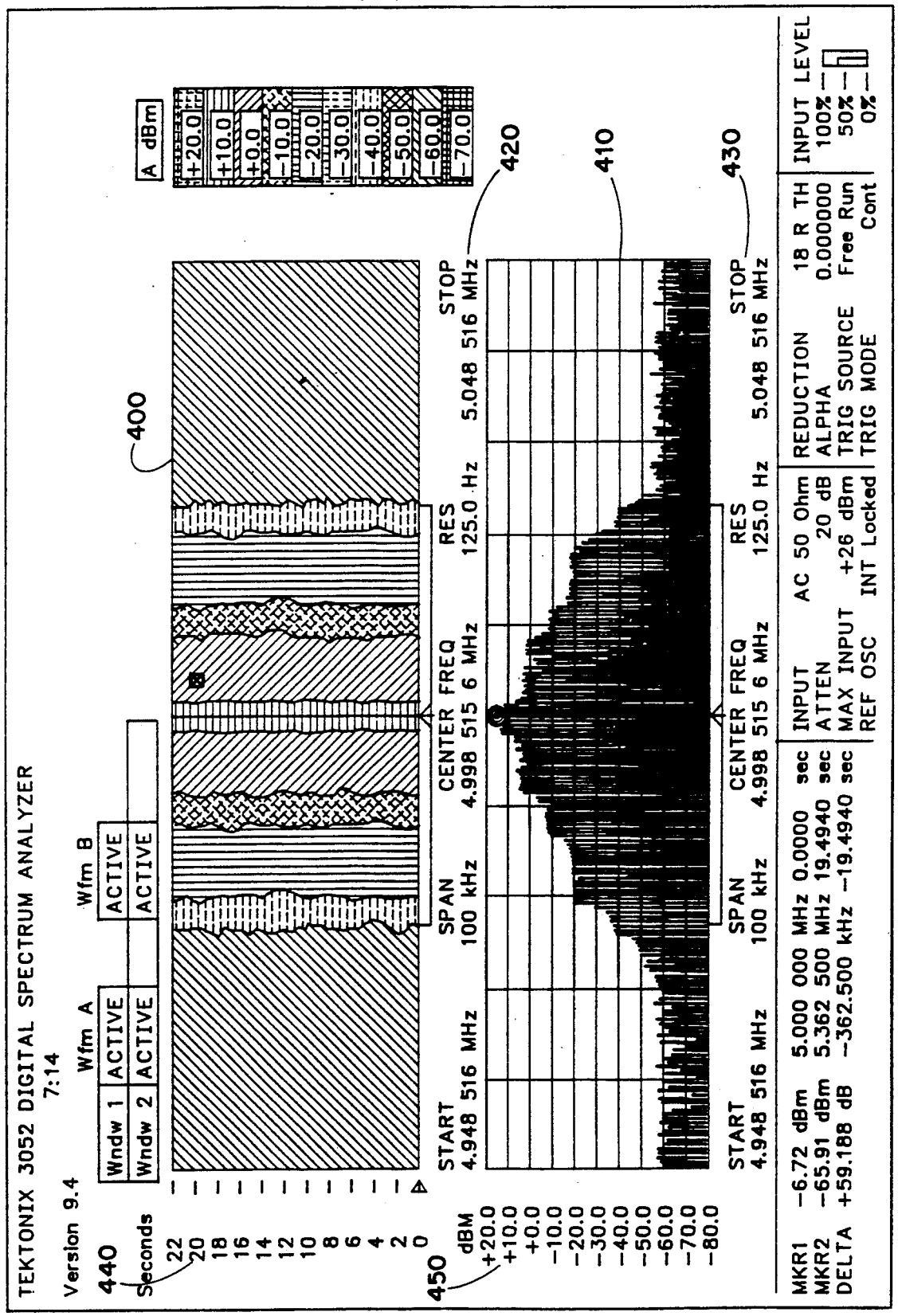
FIG. 4 is a dual display, with one color spectrogram and one amplitude versus frequency display sharing the same screen.

Referring now to FIG. 4, a dual display option is available in the spectrum analyzer being described that provides a spectrogram display 400 vertically aligned with an amplitude versus frequency display 410, so that the two displays are disposed along equivalent frequency axes 420 and 430. The scale and center frequency of this frequency axis may be commonly controlled. The horizontal axis of the spectrogram is a time axis 440, while the horizontal axis of the amplitude versus frequency display is the amplitude axis 450. In this dual display, the amplitude versus frequency display 410 may be seen as a detailed view of the current edge of the color spectrogram display 400, which in turn may be viewed as a history of the contents of the amplitude versus frequency display 410.

The user interface is implemented in the "C" programming language, running on a UNIX System V operating system, using a 68030 processor. However, these implementation choices are not important to the invention.

The instrument described above has been built and found to provide improved capabilities for identifying, saving, and analyzing continuously generated frequency domain information. However, the invention is not confined to the particular implementations described and it will be apparent to those skilled in the art that many changes and modifications may be made without departing from the invention in its broader aspects. The following claims are therefore intended to cover all such changes and modifications as fall within the true spirit and scope of the invention.

I claim:

1. A method for analyzing frequency spectra generated continuously at a faster rate that the frequency spectra can be displayed, comprising the steps of:
   continuously generating frequency spectra without gaps in the time domain information that they represent;
   defining a spectral event;
   recognizing the occurrence of the defined spectral even;
   triggering an accumulating step when a defined spectral event is recognized;
   accumulating all of the continuously generated frequency spectra generated over an interval of time in a memory means; and
   analyzing the accumulated frequency spectra after the end of the interval of time;
   displaying the frequency spectra along a time axis of the end of the interval of time.

2. A method as recited in claim 1 wherein the timing relationship between the occurrence of the spectral event and the triggering of the accumulating step is subject to operator control.

3. A method for identifying and accumulating frequency domain information of particular interest comprising the steps of:
   defining a spectral event;
   continuously accumulating frequency spectra in a circular memory;
   recognizing the occurrence of the defined spectral event; and
   halting the storage of the frequency spectra when the defined spectral event is recognized.

4. A method as recited in claim 3 wherein the recognizing step comprises the steps of:
   generating a pair of limit masks having the same format as the frequency spectra; and
   comparing each of the frequency spectra to both of the limit masks.

5. A method as recited in claim 3 further comprising the step of:
   displaying the frequency spectra along a time axis of a displaying means capable of displaying multiple frequency spectra.

6. A method as recited in claim 5 further comprising the steps of:
   identifying one of the displayed frequency spectra;
   identifying another of the displayed frequency spectra; and
   calculating a time difference between the two identified frequency spectra.

7. An apparatus for accumulating and displaying at a later time blocks of continuously generated frequency spectra which describe without gaps in time the activity of a time varying electronic signal under analysis, comprising:
   means for continuously generating frequency spectra which describe without any gaps in time the activity of a time varying electronic signal under analysis;
   means for accumulating the frequency spectra;
   means for displaying a block of accumulated frequency spectra along a time axis;
   means for defining a spectral event;
   means for detecting the occurrence of the spectral event; and means for causing the block of accumulated frequency spectra to be displayed by the displaying means upon the detection of the occurrence of the spectral event.

8. An apparatus as recited in claim 7 wherein the accumulating means comprises a circular memory and a timing relationship between the detection of the occurrence of the spectral event and the displaying of the block of accumulated frequency spectra is subject to operator control.

9. An apparatus for identifying and accumulating frequency domain information comprising:
    means for continuously generating frequency spectra;
    a circular memory to continuously accumulate the frequency spectra; and
    means for halting the further storage of frequency spectra a selectable time after the occurrence of a pre-defined spectral event.

10. An apparatus as recited in claim 9 wherein the halting means comprises:
    means for defining a spectral event;
    means for detecting the occurrence of the defined spectral event;
    means for selecting a time between the detection of the occurrence and the halting of further storage; and
    means for interrupting the further storage after the selected time.

11. An apparatus as recited in claim 10 wherein the detecting means comprises:
    means for generating a pair of limit masks having the same format as the frequency spectra; and
    means for comparing each of the frequency spectra with both of the limit masks and indicating that the defined spectral event has occurred when one of the frequency spectra is outside of the limits defined by the limit masks.

* * * * *